(12) United States Patent
Gao (10) Patent No.: US 11,672,099 B2
(45) Date of Patent: Jun. 6, 2023

(54) SYSTEM LEVEL STRUCTURE FOR BLIND MATING CONNECTIONS

(71) Applicant: BAIDU USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 79 days.

(21) Appl. No.: 17/209,917

(22) Filed: Mar. 23, 2021

(65) Prior Publication Data
US 2022/0312638 A1 Sep. 29, 2022

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 8,894,431 B2 | 11/2014 | Tiberghien et al. | |
| 9,961,800 B2 * | 5/2018 | Jin | H05K 7/20509 |
| 10,188,016 B2 * | 1/2019 | Lunsman | H05K 7/20263 |
| 10,571,635 B1 * | 2/2020 | Leigh | H04Q 11/0005 |
| 10,863,652 B1 * | 12/2020 | Conroy | H05K 7/20763 |
| 11,064,628 B2 * | 7/2021 | Thibaut | H05K 7/1489 |
| 11,129,292 B1 * | 9/2021 | Shao | H05K 7/1485 |
| 11,252,844 B2 * | 2/2022 | Shao | H05K 7/20509 |
| 11,330,741 B2 * | 5/2022 | Shao | H05K 7/20272 |
| 11,399,448 B1 * | 7/2022 | Gao | H05K 7/20781 |
| 2016/0066480 A1 * | 3/2016 | Eckberg | F16L 37/34 361/679.53 |
| 2017/0257980 A1 * | 9/2017 | Fukunaga | F16L 37/40 |
| 2018/0242478 A1 * | 8/2018 | Cui | H01R 3/08 |

FOREIGN PATENT DOCUMENTS

CN 112020264 A 12/2020

* cited by examiner

Primary Examiner — Courtney L Smith
(74) Attorney, Agent, or Firm — Womble Bond Dickinson (US) LLP (57) ABSTRACT

A blind mating connection structure for servers is disclosed. On the server side, a connector module has fluid connectors to be blind mated to fluid connectors on rack manifolds in a server rack. The connector module is coupled to a sliding channel on the server. The connector module slides horizontally and vertically in response to movement of a positioning slider on the connector module. On the rack manifold side, a guiding module has an opening that receives the positioning slider when the server is installed in the server rack. The guiding module tapers down to a centering point midway between each rack manifold. As the server is slid into the server rack, the positioning slider follows the guiding module to the center point, moving the connector module into alignment with the fluid connectors on the rack manifold for blind mating.

20 Claims, 11 Drawing Sheets

FIG. 4A Side view

FIG. 4B End view

SYSTEM LEVEL STRUCTURE FOR BLIND MATING CONNECTIONS

FIELD OF THE INVENTION

Embodiments of the present invention relate generally to server and electronic cooling. More particularly, embodiments of the invention relate to server racks, including installation and removal of server equipment that connects to a liquid cooling module.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

A server rack in a data center may contain servers and/or cooling distribution units having different types, sizes, gender, and location of liquid coolant connections. Typically, in a server rack, a coolant distribution unit couples to a coolant distribution manifold at the back of the server rack. Each server that requires liquid cooling will be connected to the coolant distribution manifold. The coolant distribution manifold often comprises a variety of interconnection hoses or a pair of distribution manifolds in the form of sealed square tubing with fluid connectors placed at fixed intervals along the tubing of the manifold. There are different types of rack manifold designs for server rack equipment connection sizes, locations, connector types, or genders. Servers and cooling distribution units in server racks require periodic service such that it is necessary to disconnect the liquid coolant connections at the back of the server rack to remove and service the server. Those connections are often deep in the back of the server rack and are not easily accessible. Blind mating of connectors requires a very high design and manufacturing accuracy which means a very low tolerance and deviations and errors to ensure proper blind mating.

BRIEF DESCRIPTION OF THE DRAWINGS

Embodiments of the invention are illustrated by way of example and not limitation in the figures of the accompanying drawings in which like references indicate similar elements.

FIG. 4A is a side view and FIG. 4B is a front view.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

A blind mating connection structure for servers is disclosed. On the server side, a connector module has fluid connectors to be blind mated to fluid connectors on rack manifolds in a server rack. The connector module is coupled to a sliding channel on the server. The connector module slides horizontally and vertically in response to movement of a positioning slider on the connector module. On the rack manifold side, a guiding module has an opening that receives the positioning slider when the server is installed in the server rack. The guiding module tapers down to a centering point midway between each rack manifold. As the server is slid into the server rack, the positioning slider follows the guiding module to the center point, moving the connector module into alignment with the fluid connectors on the rack manifold for blind mating.

In a first aspect, a blind mating structure includes a connector module and a guiding module. The connector module is configured to be coupled to a sliding channel on a server. The sliding channel is configured to slide the connector module in a horizontal (x-axis) direction and/or a vertical (y-axis) direction. The connector module includes one or more fluid connectors coupled to the connector module. A first end of each fluid connector of the one or more fluid connectors is configured to be coupled to a coolant line within the server. A second end of each fluid connector is configured to be blind mated to one of one or more corresponding fluid connectors of one or more coolant distribution manifolds in a server rack when the server is installed into server rack. A positioning slider is coupled to the connector module. The positioning slider is configured to apply horizontal force, vertical force, or both horizontal and vertical force, to the connector module as the server is installed into the server rack. In an embodiment, a distance between a center of the positioning slider on the connector module to a location of each of the one or more fluid connectors on the connector module is adjustable. In an embodiment, an orientation of the one or more fluid connectors upon the connector module is selectable or adjustable.

The guiding module is configured to be coupled to the one or more coolant distribution manifolds. The guiding module has a tapered portion with an opening at a first end of the guiding module. The guiding module tapers from the first end to a centering point at a second end of the guiding module. The centering point is located in alignment with a center of the first end. The tapered portion is configured to receive the positioning slider from the connector module of the server being installed into the server rack. The tapered portion is further configured to guide the positioning slider toward the centering point at the second end of the guiding module as the server is inserted further into the server rack. Installing the server into the server rack cause alignment of the one or more fluid connectors on the connector module of the server with the one or more fluid connectors on the one or more coolant distribution manifolds. In an embodiment, the blind mating structure further includes the sliding channel. The sliding channel can slide using roller bearings or ball bearings. In an embodiment, the blind mating structure further includes a support frame that couples the sliding channel to the server. The positioning slider can include a ball head to facilitate smooth sliding action of the positioning slider along the guiding module. The one or more fluid connectors on the connector module can be quick-disconnect fluid connectors.

A length of the positioning slider can be determined by a length of the one or more fluid connectors coupled to the connector module, a length of the one or more corresponding fluid connectors on the coolant distribution manifold, a depth of engagement of the one or more fluid connectors coupled to the connector module with one or more corresponding fluid connectors on the coolant distribution manifold, and a depth of the guiding module coupled to the coolant distribution manifold. In an embodiment, the positioning slider can be replaced at the connector module, with a different length or different shape of positioning slider. The positioning slider can be designed in different shapes. In an embodiment, the positioning slider can be a rod-like shape. In an embodiment, a head portion of the positioning slider is shaped to be received by the tapered portion of the guiding module at the centering point of the guiding module. In an embodiment, the positioning slider can be substantially a same shape as the guiding module such that a base of the positioning slider is shaped substantially the same as the opening of the guiding module, and the positioning slider tapers from the base to a head that corresponds to the centering point at the furthest depth of the guiding module.

In some embodiments, the blind mating structure can further include an elastic connection fitted between the guiding module and the one or more coolant distribution manifolds. In response to the positioning slider of the server being in contact with the centering point of the guiding module, while the server is being inserted further into the server rack, the elastic connection can be compressed, moving the centering point further away from the first end of the guiding module. The elastic connection can be designed to be compressible in different ranges, depending upon requirements for specific server and/or server rack installations. In an embodiment, the guiding module can be made of stainless steel, epoxy coated steel, or high-impact plastic. The centering point can include a flexible detent that at least partially secures a ball head of the positioning slider to the centering point when the one or more fluid connectors on the one or more coolant distribution manifolds are blind mated to the one or more fluid connectors on the connector module.

In a second aspect, an electronic rack can include a plurality of coolant distribution manifolds, each comprising one or more fluid connectors. The electronic rack can include a server having a connector module as described in the first aspect. The server can also include a cooling module with a coolant supply line, a coolant return line, and a heat transfer unit. A first end of the coolant supply line and a first end of the coolant return line can be coupled to the heat transfer unit. The server can also include the guiding module as described above in the first aspect. The connector module and guiding module, together, align the plurality of fluid connectors on the connector module with a plurality of corresponding connectors on the coolant distribution manifolds, to blind mate the server coolant circulation system to the coolant distribution manifolds.

Figure 1:
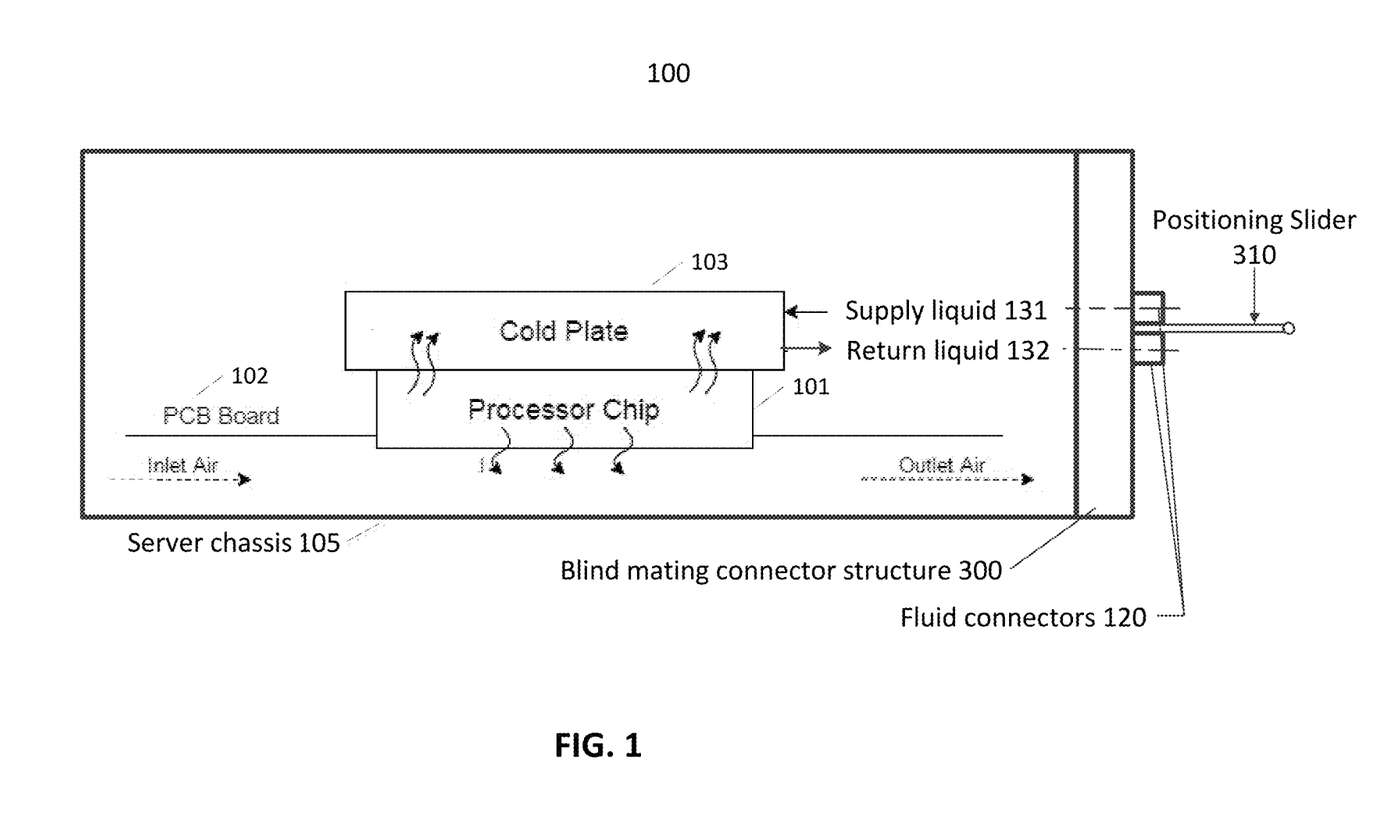
FIG. 1 is a block diagram illustrating an example of a cooling module in a server chassis having a system level structure for blind mating, according to one embodiment.

FIG. 1 is a block diagram illustrating an example of a cooling module in a server chassis having a system level structure for blind mating, according to one embodiment. The cooling module 100 can include a processor/cold plate assembly that removes heat from processor chip 101. Referring to FIG. 1, processor 101 is plugged onto a processor socket mounted on printed circuit board (PCB) or motherboard 102 coupled to other electrical components or circuits of a data processing system or server. Processor 101 includes a cold plate 103 attached to it, which is coupled to a rack manifold (not shown) via liquid supply line 132 and/or liquid return line 131 and the blind mating connection structure 300 described herein. A portion of the heat generated by processor 101 is removed by the cooling liquid lines 131 and 132 via cold plate 103. The remaining portion of the heat enters into an air space underneath or above, which may be removed by an airflow generated by a cooling fan (not shown). A blind mating connection structure 300, as described herein, can be coupled to the server chassis 105 using a frame (not shown). The blind mating structure 300, including positioning slider 310, is described in detail, below, with references to FIGS. 2, 3A-3D, 4A-4B, 5A-5B, 6A-6B, 7, and 8. The cold plate cooling liquid lines 131 and 132 can be coupled to the blind mating connection structure 300 mounted to the frame on the server chassis 105 to enable blind mating of the server's cooling lines 131/132 to one or more coolant distribution manifolds (not shown) in the server rack (not shown) that houses the server chassis 105. The liquid supply line 131 and liquid return line 132 can be hoses with either fluid 120 connectors or hose barb fittings. The cooling module 100 included in the server chassis 105 may be used in different types of servers and server racks. Blind mating connection structure 300 can ensure proper mating and configuration for the fluid systems between the server rack and the cooling module(s) in the server.

Figure 2:
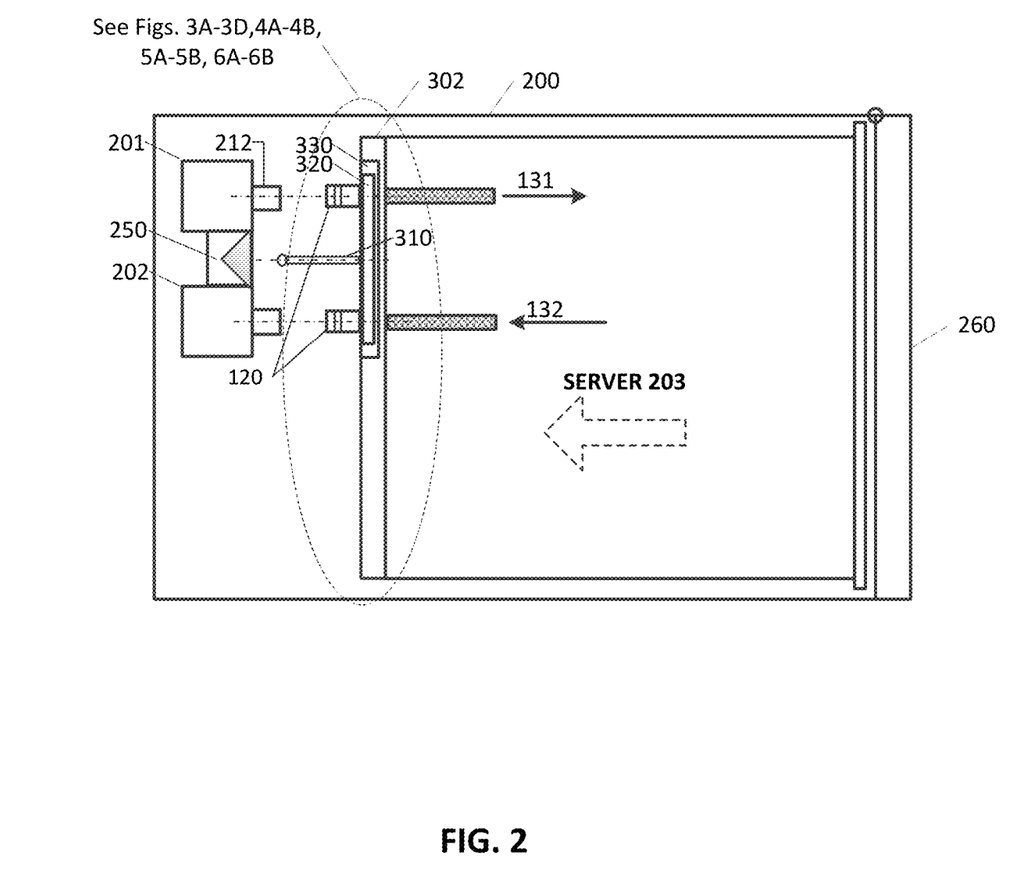
FIG. 2 illustrates plan view of an embodiment of a server chassis having a system level structure for blind mating, according to some embodiments.

FIG. 2 illustrates a plan view of an embodiment of a server 203 having a blind mating connection structure, according to some embodiments. The blind mating connection structure enables a piece of information technology (IT) equipment, such as server 203, to be slid into the server rack 200 and blind mated to a portion of the fluid connectors 212 on the coolant distribution manifolds 201 and 202 (collectively, 201/2) via the blind mating connection structure. The blind mating connection structure can include two portions. A first portion includes a connector module 320 that is mounted to the chassis of server 203. A second portion includes a guiding module 250 that is mounted between the coolant distribution manifolds 201 and 202. The connectors 120 on the connector module 320 of the server blind mate to corresponding mating fluid connectors 212 on the coolant distribution manifolds 201 and 202 as the server is being slid into a server rack.

The fluid connectors 120 on the connector module 320 are initially configured to align, horizontally, diagonally, or vertically, with corresponding fluid connectors on the coolant distribution manifolds 201/2. In an embodiment, connector module 320 can have pre-drilled holes, or "punch-outs" for commonly used orientations of fluid connectors such as 0° (horizontal), 45°, 180° (vertical), or 225°. In an embodiment, connector module 320 can include a rotatable plate with a slot that permits the fluid connectors 120 of the connector module 320 to be positioned at any angle within 0° to 360° and within a slidable spacing along the slot, such as 3" to 6" center-to-center between the fluid connectors 120. Once an orientation (i.e. a rotation angle, if any, and distance between fluid connectors) is set for the fluid connectors 120 on the connector module 320, the server can be repeatedly removed from the server rack and reinstalled by blind mating, without further adjustment. Connector module 320 is connected to a sliding channel 330 that enables connector module 320 to slide horizontally (x-axis) and/or vertically (y-axis) with respect to an insertion direction (z-axis) of the server 203 into the server rack 200. An insertion direction is shown in FIG. 2 by the dashed arrow below the "server 203" reference. A positioning slider 310, coupled to the connector module 320, extends from the connector module 320 in the same direction as the server is to slide into the server rack 200. The head of the positioning slider 310 can have a ball end to facilitate to sliding along a guiding module 250 that is coupled to the coolant distribution manifolds 201 and 202 (collectively, 201/2) in the server rack 200. In embodiment, the positioning slider 310 can be replaced at the connector module 320 with a different positioning slider 310, such as a positioning slider 310 that is longer, or wider, or has a different cross-sectional profile. A cross-sectional profile of the positioning slider can be circular, oval, triangular, square, hexagonal, or other cross-section shape.

As server 203 is slid into server rack (not shown), positioning slider 310 moves toward a first end of a tapered portion of guiding module 250. The tapered portion is open at its widest in a direction facing toward server 203, and the tapered portion slopes toward a centering point (not shown) at the deepest recess of guiding module 250. If there is any misalignment between the positioning slider 310 and the centering point of guidance module 250, the head of the positioning slider 310 comes into contact with the sloped sides of guiding module 250. The sloped sides of guiding module 250 cause the positioning slider 310 to follow the slope of guiding module 250, as server 203 is slid further toward the coolant distribution manifolds 201/2. The sloped edges of guidance module 250 exert one or more forces onto the positioning slider 310. The forces are transferred, by the positioning slider 310, to the connector module 320, causing the connector module 320 to slide along sliding channel 330. The sliding action of the connector module 320 works to align the fluid connectors 120 on the connector module 320 with corresponding fluid connectors 212 on the coolant distribution manifolds 201/2.

In FIG. 2, a server 203 is illustrated that has a cooling module (not shown) included within the server 203. The cooling module is described above with reference to FIG. 1. The cooling module within the server 203 may include one or more hoses, tubes, or piping such as for a coolant supply line 131 and a coolant return line 132, or other coolant line. The coolant lines 131/132 can be fluidly coupled at one end to the cooling module (not shown) in the server 203. The other end of each of the coolant supply 131 and coolant return lines 132 can be coupled to a fluid connector 120 on the connector module 320. In an embodiment, coolant lines 131 and 132 can also include fluid connectors 120 on their ends.

FIGS. 3A through 3D illustrate section views of a server 203 being blind mated to coolant distribution manifolds 201/202 using a blind mating connection structure, according to embodiments. The views in FIGS. 3A through 3D are from a side, or section, view of a server rack (not shown) that includes coolant distribution manifolds (or, "rack manifolds") 201/2 and a server 203 to be inserted into the server rack (not shown). In the views of FIGS. 3A through 3D, the coolant distribution manifolds 201/2 are located at a rear side (left, in FIGS. 3A-3D) of the rack server (not shown) and the server 203 is being inserted into the rack server (not shown) from the front side (right, in FIGS. 3A-3D) of the rack server (not shown) toward the coolant distribution manifolds 201/2. Guiding module 250 is shown coupled to rack manifolds 201/2, with centering point 251 at the deepest portion of guiding module 250. Guiding module 250 is mounted to, and between, coolant distribution manifold 201 and coolant distribution manifold 202. Centering point 251 is equidistant between a centerline of a fluid connector 212 on coolant distribution manifold 201 (e.g. a coolant supply distribution manifold) and a centerline of a fluid connector 212 on coolant distribution manifold 202 (e.g. a coolant return distribution manifold). Server 203 is installed from right to left, as indicated by the dashed arrow labeled "install server."

Figure 3A:
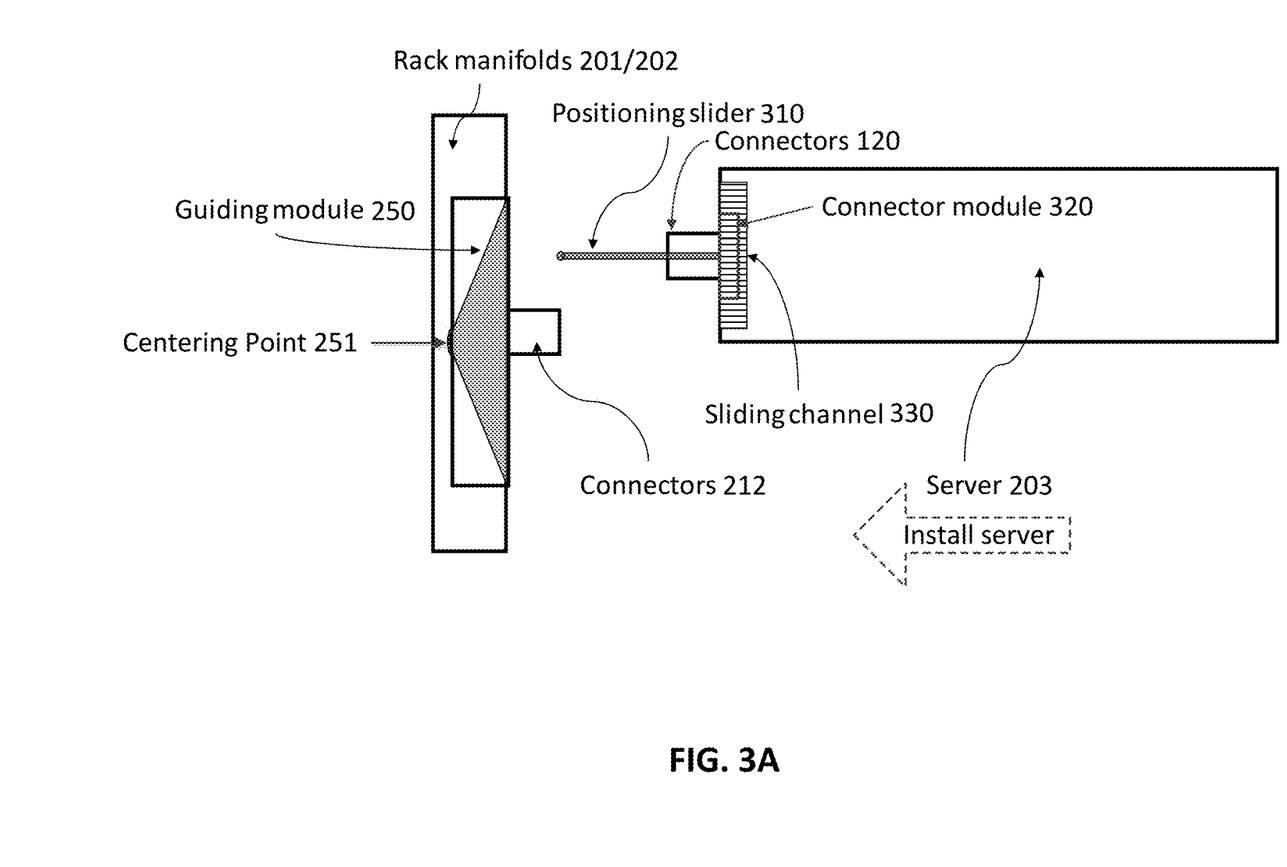
FIGS. 3A-3D illustrate a section view of a server chassis being blind mated to a coolant distribution manifold using system level structure for blind mating, according to some embodiments.

FIG. 3A illustrates key components of the blind mating structure. FIG. 3A illustrates a status of the blind mating structure before the server is populated into a server rack (not shown). Key components of the server side of the blind mating structure include a positioning slider 310, a connector module 320, and a sliding channel 330. In an embodiment, positioning slider 310 may include a ball at the head of the positioning slider 310 which facilitates movement of the positioning slider 310 over the surface of a guiding module 250 on the rack manifold side of the blind mating structure. Connector module 320 includes one or more fluid connectors 120. Each fluid connector 120 corresponds to a coolant line inside of server 203. One end of the coolant line is coupled a cooling module inside the server 203. The other end of the coolant line is coupled to the fluid connector 120. Connector module 320 is coupled to a sliding channel 330 that enables the connector module 320 to slide in the horizontal and vertical direction, in the plane of the rear of the server 203. Connector module 320 slides along sliding channel 330 in response to forces applied to positioning slider 310 exerted by positioning slider 310 contacting an inner surface of guiding module 250, as the server 203 is being installed into the server rack (not shown).

On the rack manifold side, a guiding module 250 is installed between two rack manifolds 201/202 (collectively, 201/2), each rack manifold having one or more fluid connectors 212 associated with the rack manifold. The rack manifolds 201/2 can be a coolant supply distribution manifold and a coolant return manifold for circulating cooling liquid through a cooling module of the server 203. The guiding module 250 can include a guiding surface which can include guiding channels formed into the surface of the guiding module 250. For example, a guiding module 250 can have a rectangular opening at a first end of the guiding module 250. The opening on the first end of the guiding module 250 faces toward the server 203 as the server 203 is being installed in the server rack (not shown). The opening on the first end of the guiding module 250 tapers to a centering point 251 at a second end of the guiding module 250. The centering point 251 is a deepest point (i.e., furthest away from the server 203) within the guiding module 250. The centering point 251 is located on the guiding module 251 between the two rack manifolds 201/2, at a point that is equidistant from each of the two rack manifolds 201/2.

Figure 3B:
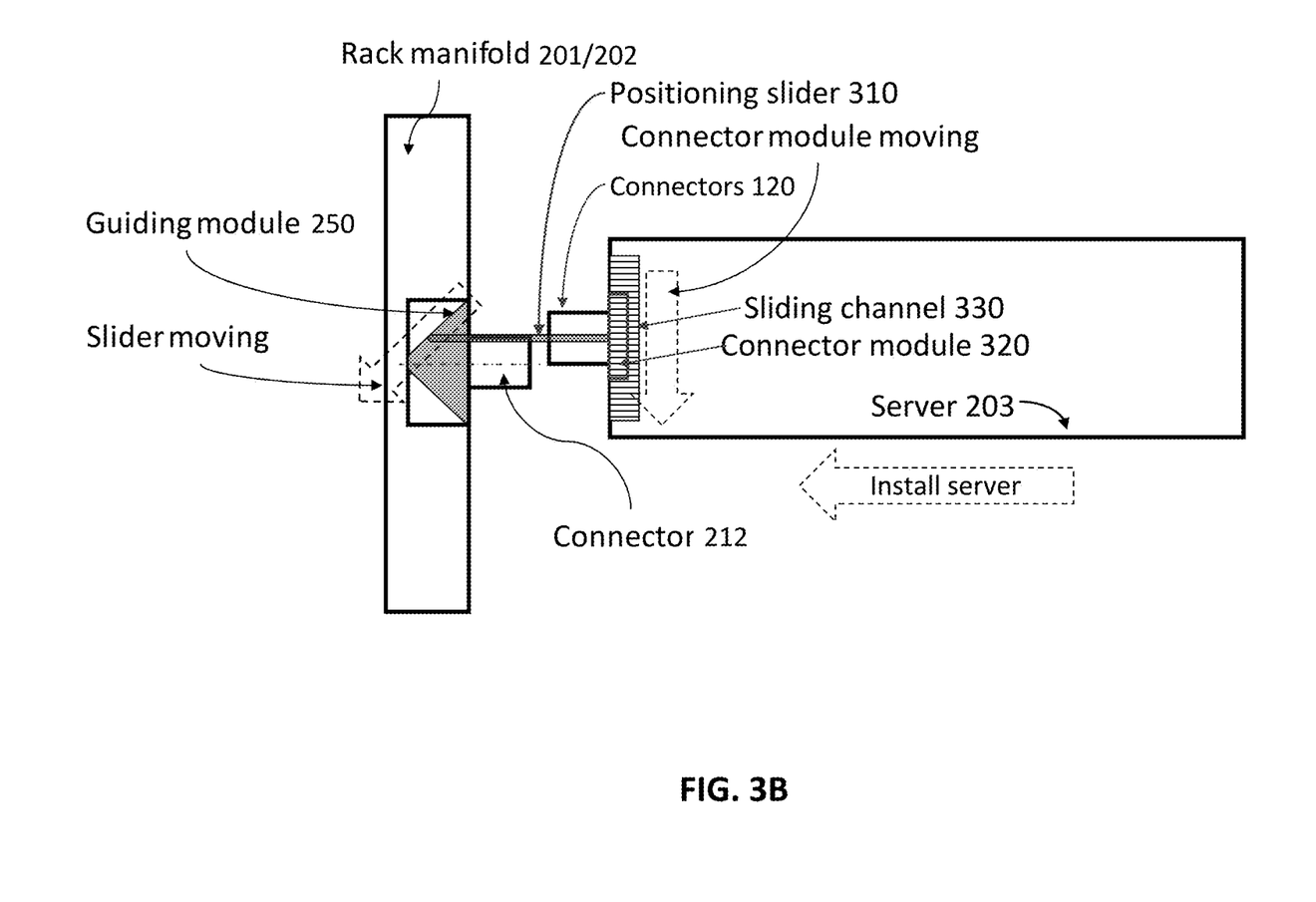

FIG. 3B illustrates the operation of the blind mating structure during populating of the server 203 into the server rack (not shown). Referring now to FIG. 3B, it can be seen that the server 203 fluid connectors 120 are not aligned with the rack fluid connectors 212. As the server 203 is installed into the rack, the positioning slider 310 first contacts the guiding channel within the guiding module 250. The positioning slider 310 contacts the sloped surface of the guiding module 250 and the positioning slider 310 slides along the surface of the guiding module 250, toward centering point 251. The sloped surface in guiding module 250, in combination with the force of sliding the server 203 into the server rack (not shown), generates vector force components upon positioning slider 310 in one or more of the horizontal (x-axis) and vertical (y-axis) directions, with respect to the rear face of the server 203. As indicated by the label "slider moving" and the corresponding dashed arrow facing diagonally down and left, the positioning slider 310 moves along the sloped surface of the guiding module 250 as server 203 is installed into the server rack (not shown). The forces upon the positioning slider 310 are transferred by the positioning slider 310 to connector module 320, causing connector module 320 to slide along sliding channel 330, indicated by the label "connector module moving" and the dashed arrow directed downward.

Figure 3C:
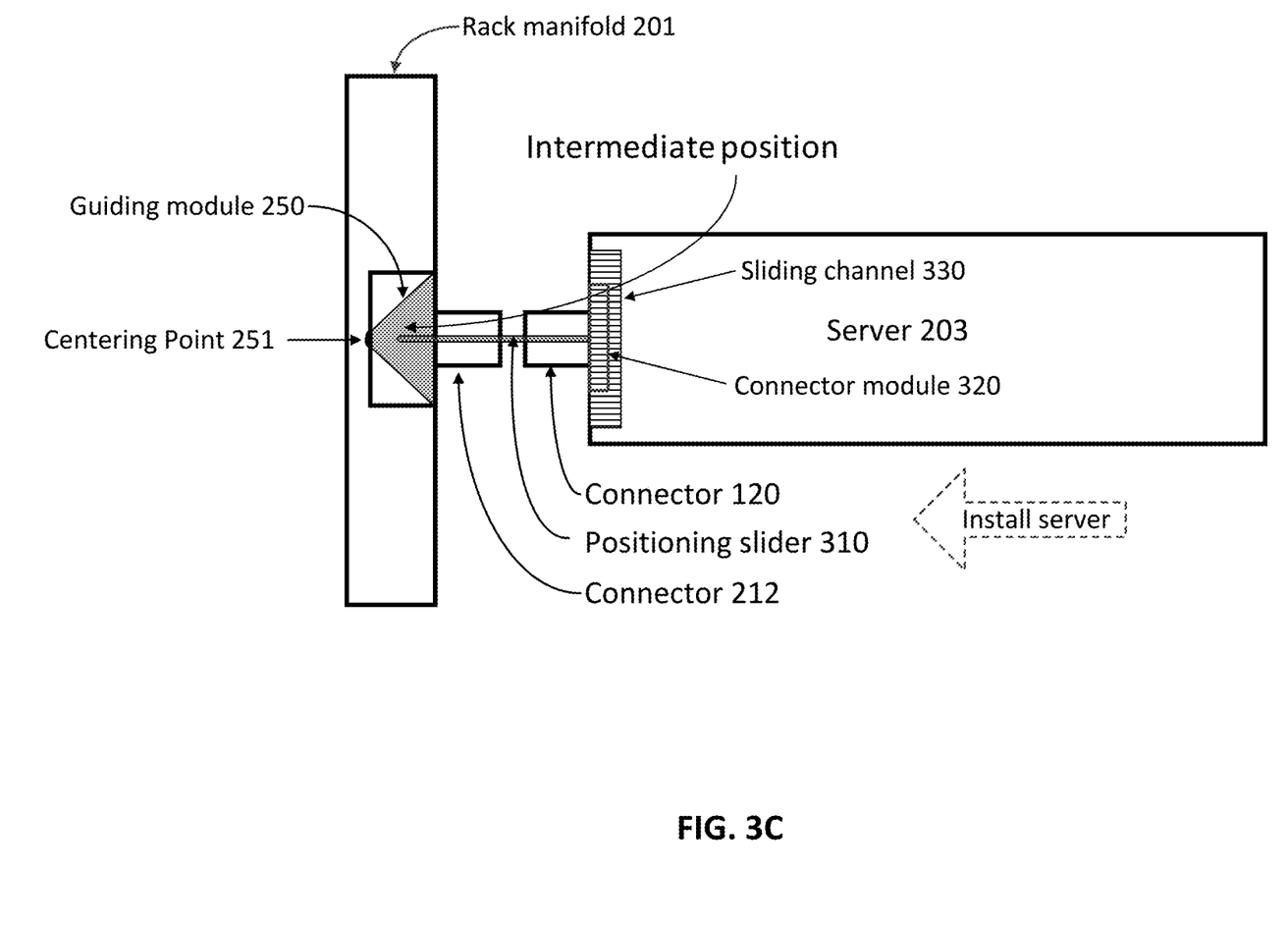

Referring now to FIG. 3C, an intermediate position is illustrated, during the populating of the server 203 in the server rack (not shown). The positioning slider 310 may directly match to the, e.g., vertical centerline of the guiding module 250 in one scenario. The positioning slider 310 may continue to move towards the guiding module 250 and then move along the face of the guiding channel 250. It is rare for the connector module 320, and thus positioning slider 310, to be initially in this configuration wherein the positioning slider 310 is nearly centered to the centering point 251 before populating of the server 203 into the server rack (not shown) is complete. However, this may be a common occurrence after a first time that the server 203 has been populated to the server rack (not shown). After an initial installation of the server 203 into the server rack, positioning slider 310, and thus the connector module 320, may remain reasonably close to a position of alignment with the centering point 251 for subsequent installations of the server 203 into the server rack.

Movement of connector module 320 aligns the fluid connectors 120 with the corresponding mating fluid connectors 212 on the coolant distribution manifolds 201/202. The positioning slider 310 is coupled to connector module 320. Connector module 320 is coupled to a sliding channel 330. Sliding channel 330 slides horizontally and/or vertically, in response to a location of the head of the positioning slider 310, as the server 203 being installed into the server rack (not shown). When the ball head of the positioning slider 310 reaches the centering point 251, the connector module 320 is aligned with centering point 251. Fluid connectors 120 of connector module 320 are now aligned with connectors 212 of the rack manifolds, ready to perform blind mating of the fluid connectors 120 and fluid connectors 212.

Figure 3D:
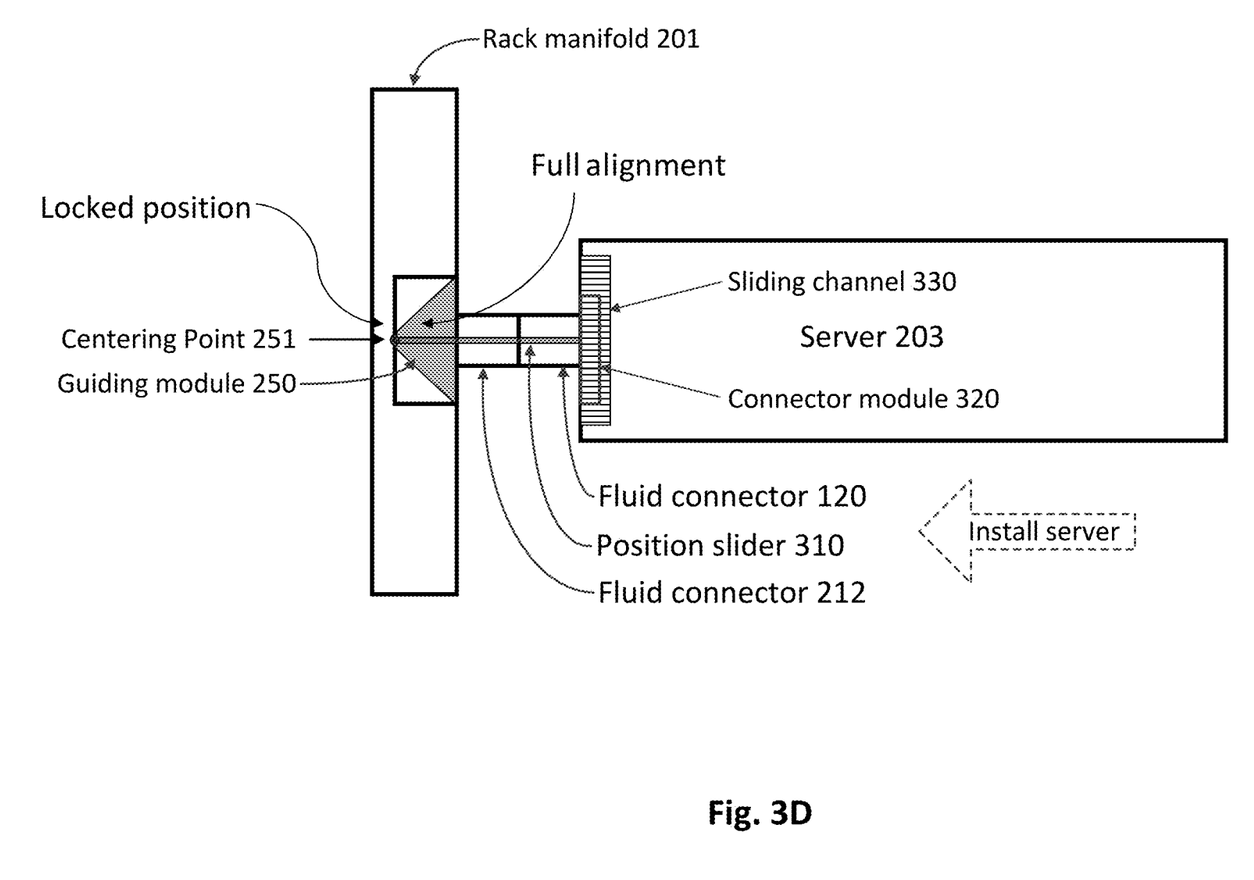

Referring now to FIG. 3D, server 203 is shown fully slid into position in the server rack (not shown). Fluid connectors 120 on connector module 320 are fully aligned and blind mated to fluid connectors 212 on coolant distribution manifolds 201/2. Positioning slider 310 is seated into centering point 251 of guiding module 250 in a "locked position." In an embodiment, centering point 251 may include a detent that at least partially secures the ball head of the positioning slider 310 into the centering point 251. Further locking forces are generated by the act of mating fluid connectors 120 to fluid connectors 212. Once the positioning slider reaches the centering point 251, the fluid connectors 120 and 212 may perfectly blind mate. However, this may not always happen due to many factors. The blind mating structure disclosed herein addresses scenarios to provide complete and accurate blind mating.

Figure 4A:
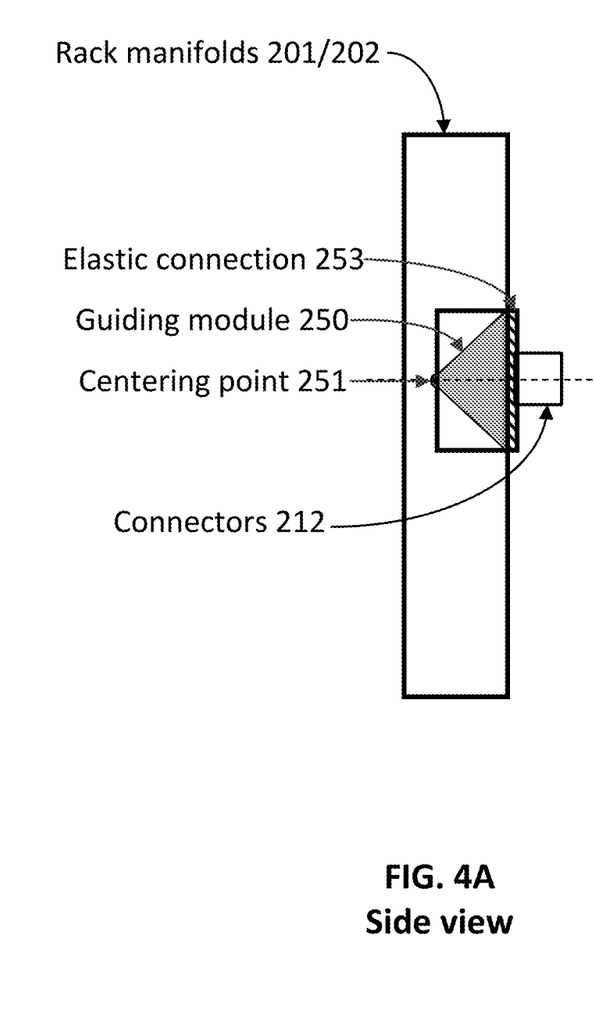
FIGS. 4A and 4B illustrate section views of a coolant distribution manifold having a guiding module for blind mating using a system level structure, according to some embodiments.
Figure 4B:
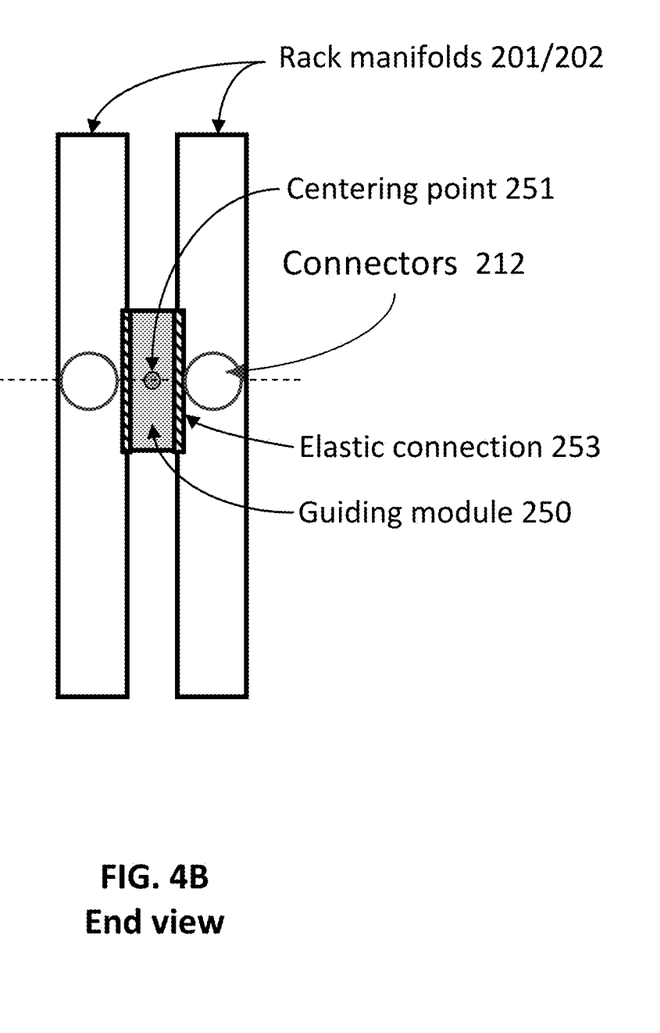

FIGS. 4A and 4B illustrate section views of a coolant distribution manifold having a guiding module for blind mating using a system level structure, according to some embodiments. FIG. 4A illustrates a side view of guiding module 250 mounted to coolant distribution manifolds ("rack manifolds") 201/2. FIG. 4B illustrates an end view, looking from a server 203 in the server rack (not shown) toward rack manifolds 201/2 mounted in the rear of the server rack (not shown).

Elastic section 253 can be mounted between guiding module 250 and rack manifolds 201/2. As is known in the art, server racks are often provided with a mechanical "stop" tab or ear on a frame of the server rack that prevent the server from being inserted into the frame beyond the "stop" point. The stop point is a maximum distance that a server may be installed into the server rack (not shown), with respect to a front of the server rack. However, a distance of a front face of the rack manifolds, facing into the server rack, may not be sufficiently exact for full mating of the fluid connectors 120 on the server 203 to fluid connectors 212 on the rack manifolds 201/2. In the embodiment of FIGS. 4A and 4B, an elastic connection 253 can absorb a small amount of a difference in distance between the fluid connectors 120 on the connector module 320 to ensure full and proper mating to the fluid connectors 212 on the rack manifolds 201/202. As the server 203 is pushed into the server rack (not shown), if the positioning slider 310 contacts the centering point 251 of the guiding module 250 before the server 203 reaches the "stop" tab in the server rack, and before the fluid connectors 120 and 212 are fully blind mated, the positioning slider 310 pushes on the centering point 251 of the guiding module 250 and compresses the elastic connection 253 a small amount until the fluid connectors 120 and 212 are fully blind mated. The entire guiding module 250, including centering point 251, can be pushed to the left side in FIG. 4A causing a compression of the elastic connection 253. The compression rate of the elastic connection 253 can vary to accommodate different scenarios.

Figure 5A:
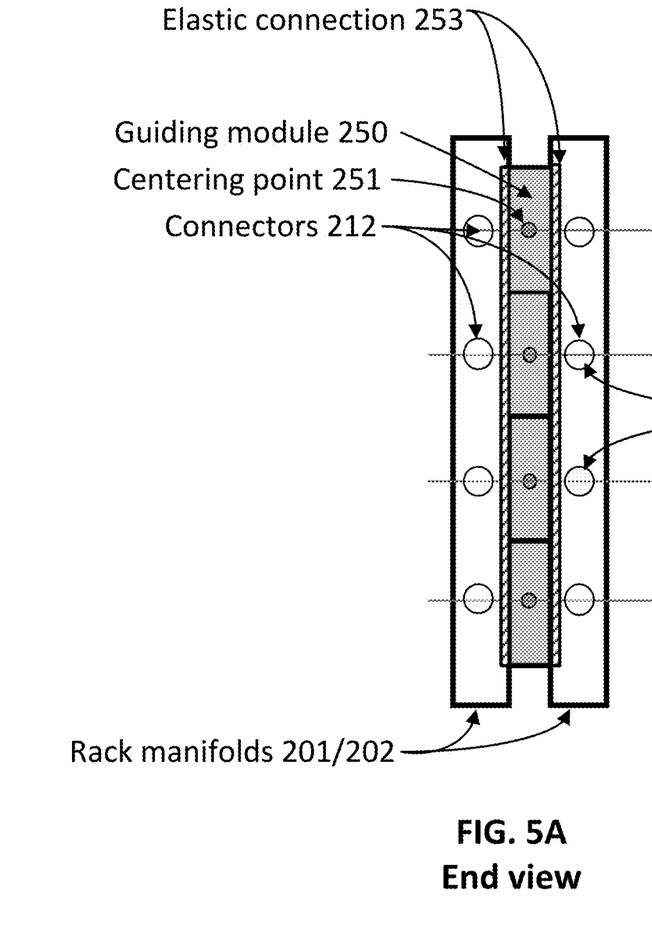
FIGS. 5A and 5B illustrate section views of a coolant distribution manifold in a server rack that supports blind mating using a system level structure, according to some embodiments.
Figure 5B:
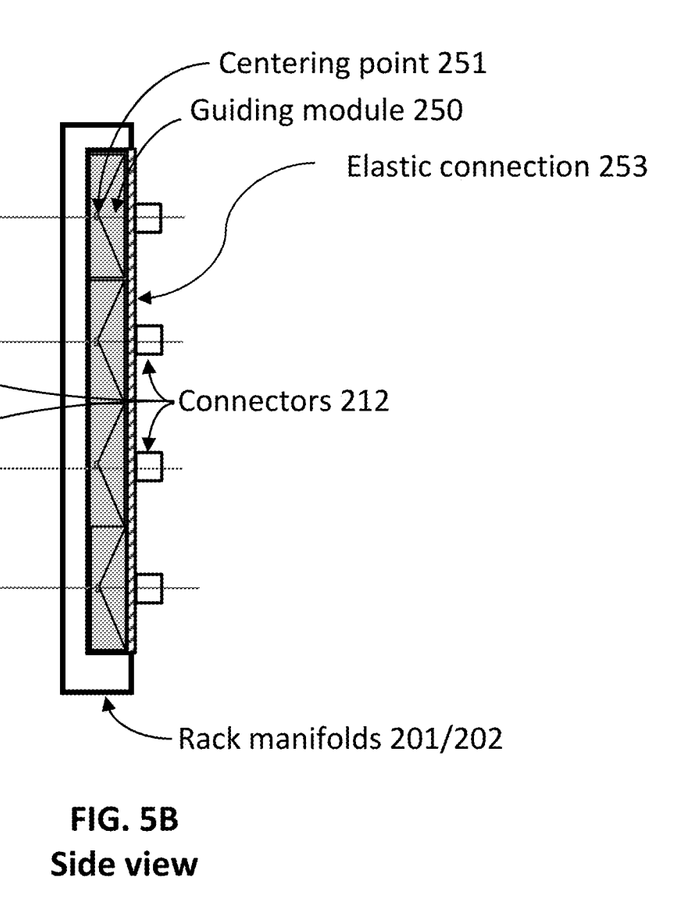

FIGS. 5A and 5B illustrate section views of coolant distribution manifolds ("rack manifolds") 201/202 in a server rack (not shown) that supports a blind mating connection structure, according to some embodiments. The blind mating connection structure described in FIGS. 4A and 4B, above, is extended to illustrate four guiding modules 250, each with an elastic connection 253 fixed between the guiding module 250 and the rack manifolds 201/202. In an embodiment, elastic connection 253 can be a strip of low density, compressible, foam rubber, or a low density compressible rubber. In an embodiment, the elastic connection 253 can be in the form of a strip of material on the face of the rack manifolds. In an embodiment, a single strip of material can be applied, such as with an adhesive or self-adhesive, to accommodate a plurality of guiding modules 250. Each guiding module 250 is configured to receive a positioning slider (not shown) of a connector module (not shown) to facilitate blind mating of a plurality of fluid connectors (not shown) on a connector module (not shown) attached to a server (not shown) to a pair of fluid connectors 212 on a pair of rack manifolds 201/202. Blind mating operation and functionality of guiding module 250, centering point 251, elastic connection 253, rack manifolds 201/202 and fluid connectors 212 have been described above and will not be repeated again here.

The guiding module can be attached to an existing rack manifold to add the guiding feature to an existing server rack. Although in FIGS. 5A and 5B the guiding modules 250 have been illustrated as being similar, or the same, this needed not be the case. Different configurations of guiding modules 250 can be implemented for differing server types installed, or to be installed, into the server rack and for different configurations of server racks.

Figure 6A:
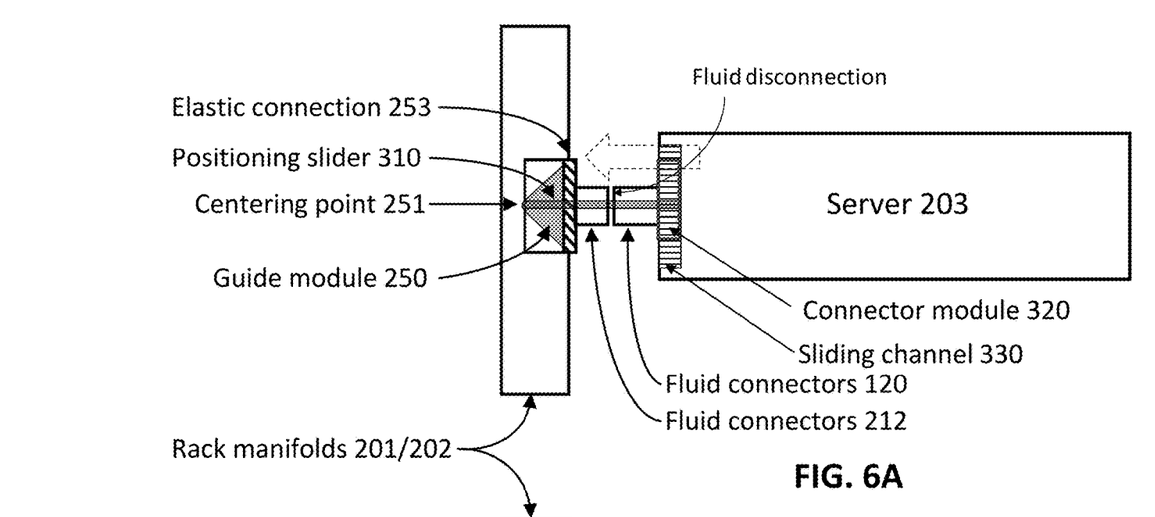
FIGS. 6A and 6B illustrate section views of a server being blind mated to a coolant distribution manifold having a guiding module with an elastic element, according to some embodiments.
Figure 6B:
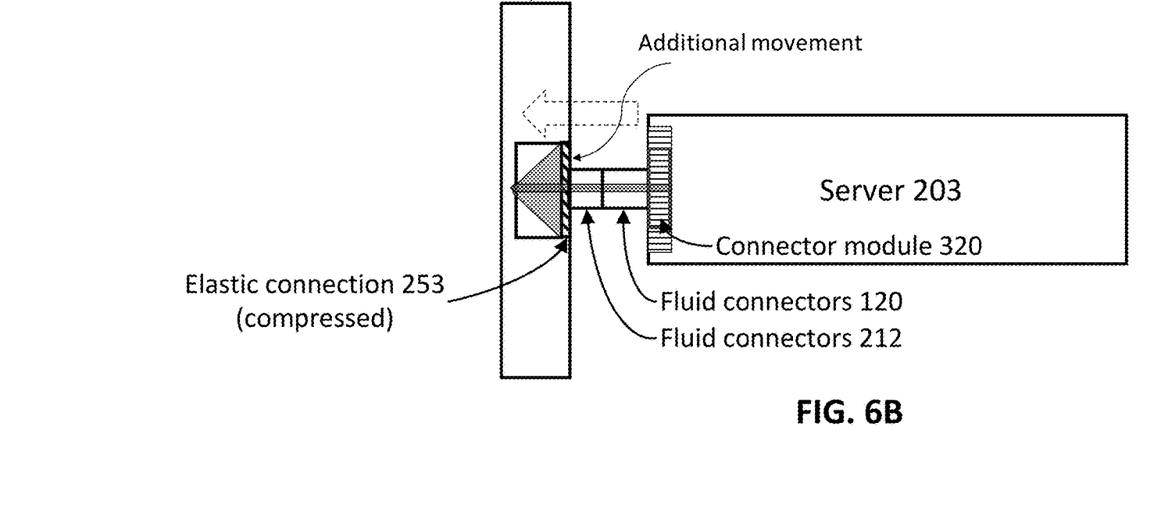

FIGS. 6A and 6B illustrate section views of a server 203 being blind mated to fluid connectors 212 of coolant distribution ("rack") manifolds 201/202 having a guiding module 250 with an elastic connection 253, according to some embodiments. Referring to FIG. 6A, as the server 203 is installed into the server rack (not shown), positioning slider 310 may reach the centering point 251 of guiding module 250 before the fluid connectors 120 on the connector module 320 of the server 203 fully connects ("blind mates") to corresponding fluid connectors 212 on rack manifolds 201/202. In FIG. 6A, this is shown by label "fluid disconnection," pointing to the gap between fluid connectors 212 and fluid connectors 120.

Referring now to FIG. 6B, to fully blind mate the fluid connectors 120 and 212, additional movement can be provided to further push the server 203 into the server rack (not shown). The additional movement is indicated by the dashed line arrow, pointing left in the FIG. 6B. The additional movement is further indicated by compression of the elastic connection 253, labeled "additional movement" in FIG. 6B. The additional movement causes the positioning slider 310 to push on the guiding module 250, thereby compressing the elastic connection 253 by a small amount. The fluid connectors 120 and 212 are now fully blind mated, making a completed fluid connection. In an embodiment, the centering point 251 can have a small detent that captures, or partially captures, a ball end on the head of the positioning slider 310 to help retain the fluid connector mating.

Figure 7:
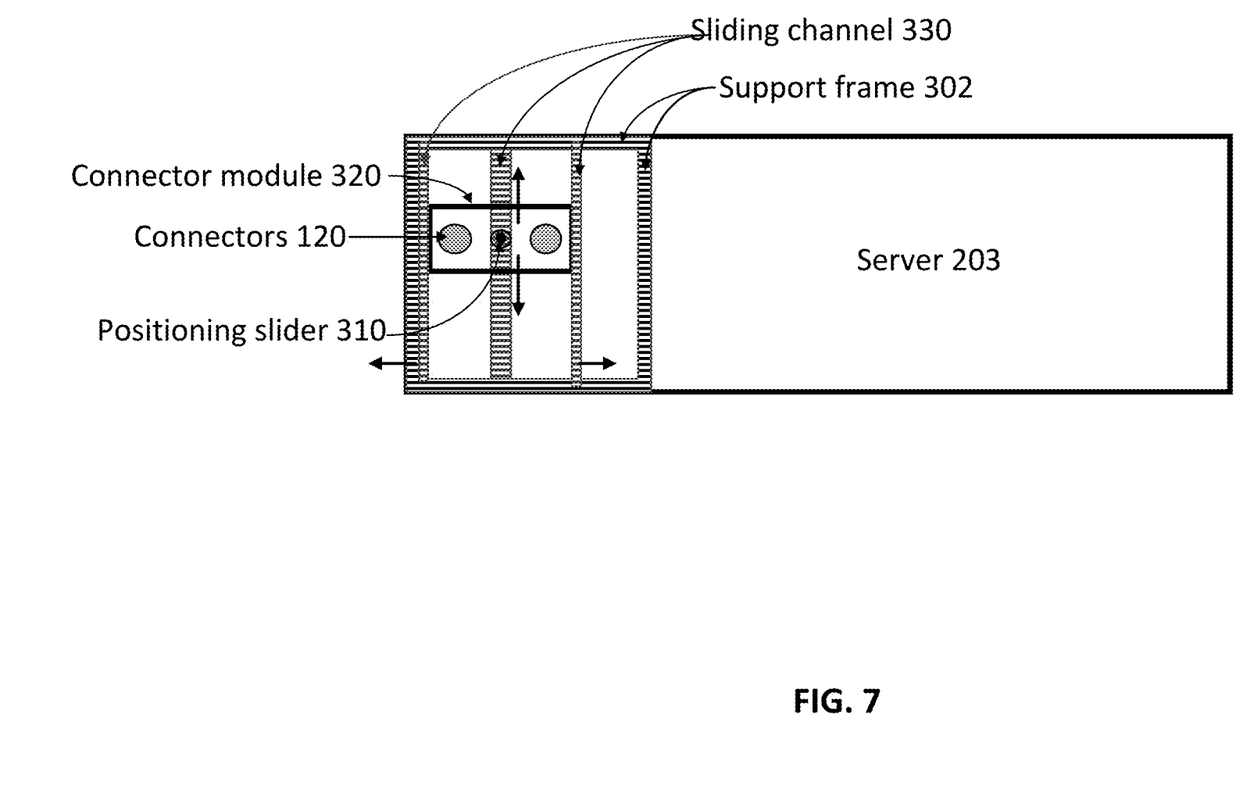
FIG. 7 illustrates a rear view of details of components of a server system level structure for blind mating, according to one embodiment.

FIG. 7 illustrates an end view of components of a system level structure for blind mating, according to one embodiment. FIG. 7 shows the portion of the blind mating connection structure that attaches to the rear of the server 203. The server side of the blind mating structure includes one or more fluid connectors 120 coupled to connector module 320. Inside the server, one end of a coolant supply line and one end of a coolant return line (not shown) are coupled to a heat transfer unit (not shown) of a cooling module (not shown). The other end of the coolant supply line (not shown) is coupled to one of the fluid connectors 120, and the other end of the coolant return line (not shown) is coupled to the other of the fluid connectors 120, on the connector module 320. The connector module 320 is coupled to sliding channel 330. The connector module 320 can slide along sliding channel 330 in the vertical direction (y-axis), as indicated by the two vertical arrows at the connector module 320. The sliding frame 330 also enables the connector module 320 to slide horizontally (x-axis) as indicated by the two horizontally opposing arrows. In an embodiment, sliding frame 330 can be fixed to the server 203 using a support frame 302. In an embodiment, sliding frame 330 can be constructed such that sliding frame 330 can be attached to a chassis of the server without using a support frame 302.

Sliding frame 330 can be constructed from formed channel material having roller bearings, ball bearings, lubricant, and/or other materials to facilitate the sliding action the sliding frame 330. Formed channel material can be metal, e.g. steel, stainless steel, aluminum or other material. Channels material can be cut from known shapes, e.g. c-shaped channel or box channel or can be cut or machined from other known shapes. In an embodiment, channel material can be formed by extrusions or press-shaping to configurations such as are used in furniture drawers, racks, or other sliding rails.

Positioning slider 310 is an elongated member, fixed to the connector module 320 to be perpendicular to a plane of the rear of the server 203. In an embodiment, positioning slider 310 is removable and replaceable from the connector module 320, such as to accommodate installation of an appropriate length and/or type of positioning slider 310 for a particular installation. A cross-section of the positioning slider 310 can be round, oval, square, oblong, or other shape. A length of the positioning sliding 310 can be based upon a distance between a "stop" tab in the server rack (or a suitably designed fixed rear-end point for the server when installed in the rack). The length of the positioning slider 310 is further determined based upon a depth of the connector module 320 from the rear of the server 203, a distance from the face of the connector module to an end of the fluid connectors 120 that are coupled to connector module 320, a length of the fluid connectors 212 on rack manifolds 201/2, and a depth of guiding module 250 from a face of the rack manifolds 201/2 to a deepest point of the guiding module 250 at the centering point 251. Cross-sectional shape and dimensions of the cross-sectional shape of the positioning slider 310 can be chosen based upon the determined length of the positioning slider 310. Cross-sectional of the positioning slider 310 can further be based upon a steepness of the sloped sides of the guiding module, the horizontal and vertical forces applied to the positioning slider 310 during installation of the server 203 into the server rack, and resistance forces in the sliding channel 330 movement. Design of the cross-sectional shape and dimensions of the positioning slider 310 ensure that the positioning slider 310 remains straight, rigid, and does not bend substantially during use in sliding the position the connector module 320.

Figures 8A, 8B:
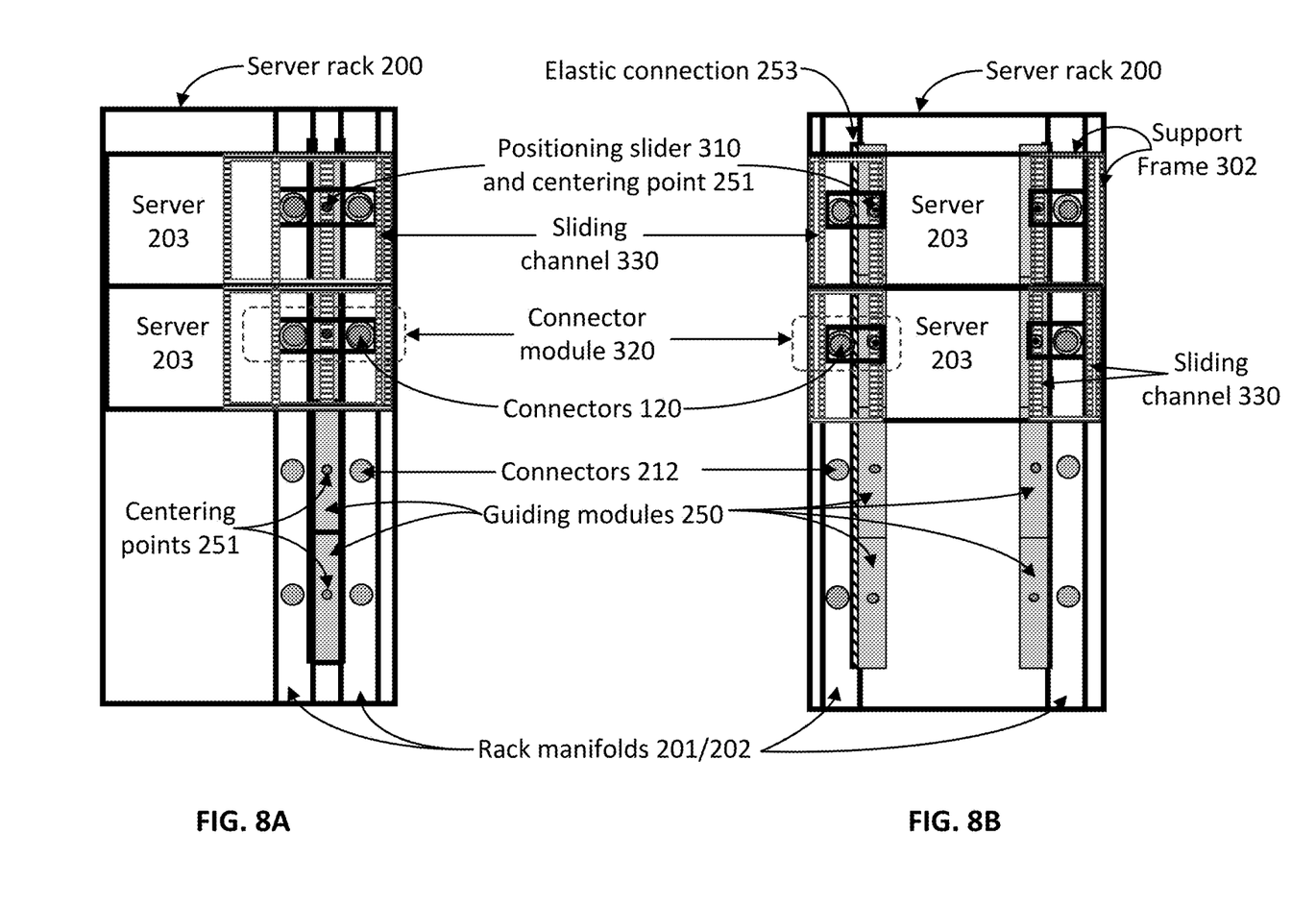
FIGS. 8A and 8B illustrate rear views of a server rack that receives servers having a system level structure for blind mating, according to one embodiment.

FIGS. 8A and 8B illustrate rear views of a server rack 200 that receives servers 203 having a system level structure for blind mating, according to one embodiment. In FIGS. 8A and 8B, the view is from the perspective of the front of the server rack 200, looking through the server rack 200, toward the rear of the server rack 200. Components of both the server 203 side of the blind mating connecting structure and the rack manifolds 201/2 side of the blind mating connecting structure are shown.

Referring to FIG. 8A, server rack 200 has two servers 203 installed in the server rack 200. Two rack manifolds 201/202 are installed in the rear of the server rack 200. Rack manifolds 201/2 can be, e.g., a coolant supply distribution manifold and a coolant return collection manifold. The rack manifolds 201/2 can each be configured as a sealed elongated tubing, e.g. square tubing, having a plurality of fluid connectors 212 connected at predetermined intervals. Typically, a pair of fluid connectors 120 on a connector module 320 on server 203 will be blind mated to a corresponding pair of rack manifolds. In the configuration of FIG. 8A, the two rack manifolds 201/2 are sufficiently close together that a single connector module 320 having fluid connectors 120 on each server 203 can blind mate to corresponding fluid connectors 212 on rack manifolds 201/2. Each connector module 320 is coupled to sliding channel 330 that is, in turn, connected to a chassis of the server 203. The connector module 320 further includes a positioning slider 310. Details and operation of the connector module 320 and its components are described above with reference to at least FIGS. 2, 3A-3D, 4A-4B, 6A-6B and 7 and will not be described again here.

Each pair of fluid connectors 212 that blind mate to one server has a guiding module 250 installed between the pair of fluid connectors 212 on rack manifolds 201/2. Each guiding module 250 has a centering point 251, and can optionally have an elastic connection 253 installed between the guiding module 250 and the rack manifolds 201/2. The guiding modules 250, centering point 251, and elastic connection 253 have been described in detail, above, with reference to FIGS. 2, 3A-3D, 4A-4B, 5A-5B, 6A-6B and 7 and will not be described again here.

Referring now to FIG. 8B, two servers 203 are installed in rack server 200. Here, rack manifold 201 and rack manifold 212 are separated, one for coolant supply and one for coolant return. One rack manifold is installed at the far left of the server rack 200 and the second rack manifold is installed at the far right of the server rack 200. In this embodiment, two connector modules 320 can be used, with each connector module 320 having a single fluid connector 120 and a positioning slider 310. The single fluid connector 120 can correspond to one of the either the coolant supply line or coolant return line (not shown) inside the server 203. Each connector module 320 is fixed to its own sliding channel 330 that enables the connector module 320 to slide in the horizontal (x-axis) direction and the vertical (y-axis) direction in response to positioning slider 310 contacting the inner faces of guiding module 250. Similarly, at the right in FIG. 8B, a single fluid connector 120 is coupled to another connector module 320 for the server 203. The single fluid connector 120 corresponds to, e.g., the other of the coolant supply line or coolant return line (not shown) inside the server 203. In other respects, operation of the connector module 320 with the single fluid connector 120 are similar the connector module with a single fluid connector 120 that has already been described in FIG. 8B. In FIG. 8B, a manner of attachment of the guiding module 250 to the rack manifold 201 or 202 can have additional rigidity in its design to ensure that guiding module 250 does not flex substantially at its connection point to rack manifold 201 or 202. In other respects, the design and functionality of guiding module 250 and connector module 320 are substantially the same as previously described embodiments. In FIG. 8B, elastic connection 253 can be coupled between guiding module 250 and a rack manifold 201 or 202.

In the foregoing specification, embodiments of the invention have been described with reference to specific exemplary embodiments thereof. Different selection of connector types, hose, tubing, piping, and structural frame members, and orientations of assemblies can be implemented by one of skill in the art in possession of this disclosure. Different server rack orientations, e.g. vertical, or upward/downward, can be implemented using this disclosure. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A blind mating structure comprising:
    a connector module configured to be coupled to a sliding channel on a server, the sliding channel configured to slide the connector module in a horizontal (x-axis) direction and a vertical (y-axis) direction, the connector module having:
        one or more fluid connectors coupled to the connector module, a first end of each fluid connector of the one or more fluid connectors configured to be fluidly coupled to a coolant line within the server, and a second end of each fluid connector configured to be blind mated to one of one or more corresponding fluid connectors of one or more coolant distribution manifolds in a server rack when the server is installed into the server rack, and
        a positioning slider coupled to the connector module, the positioning slider configured to apply horizontal force, vertical force, or both horizontal and vertical force, to the connector module as the server is installed into the server rack; and
    a guiding module, configured to be coupled to the one or more coolant distribution manifolds, the guiding module having a tapered portion with an opening at a first end of the guiding module, and the guiding module tapering from the first end to a centering point at a second end of the guiding module,
    wherein the positioning slider applies the horizontal force, the vertical force, or both the horizontal and the vertical force to the connector module in response to the positioning slider contacting the tapered portion of the guiding module during installation of the server into the server rack.

2. The blind mating structure of claim 1, wherein the centering point is located in alignment with a center of the first end, wherein the tapered portion is configured to receive the positioning slider from the connector module of the server being inserted into the server rack, and wherein the tapered portion is configured to guide the positioning slider toward the centering point at the second end of the guiding module as the server is inserted further into the server rack, thereby aligning the one or more fluid connectors on the connector module of the server with the one or more fluid connectors on the one or more coolant distribution manifolds.

3. The blind mating structure of claim 1, further comprising a support frame that couples the sliding channel to the server.

4. The blind mating structure of claim 1, wherein the positioning slider comprises a ball head.

5. The blind mating structure of claim 1, wherein a head portion of the positioning slider is shaped to be received by the tapered portion of the guiding module at the centering point of the guiding module.

6. The blind mating structure of claim 1, wherein the sliding channel comprises roller bearings or ball bearings.

7. The blind mating structure of claim 1, wherein a length of the positioning slider is determined by a length of the one or more fluid connectors coupled to the connector module, a length of the one or more corresponding fluid connectors on the coolant distribution manifold, a depth of engagement of the one or more fluid connectors coupled to the connector module with one or more corresponding fluid connectors on the coolant distribution manifold, and a depth of the guiding module coupled to the coolant distribution manifold.

8. The blind mating structure of claim 1, wherein the positioning slider is replaceable at the connector module, with a different length or different shape of positioning slider.

9. The blind mating structure of claim 1, further comprising an elastic connection fitted between the guiding module and the one or more coolant distribution manifolds, such that, in response to the positioning slider of the server being in contact with the centering point while the server is being inserted further into the server rack, the elastic connection is compressed, moving the centering point further away from the first end of the guiding module.

10. The blind mating structure of claim 1, wherein an orientation of the one or more fluid connectors upon the connector module is selectable or adjustable.

11. The blind mating structure of claim 10, wherein a distance between a center of the positioning slider on the connector module to a location of each of the one or more fluid connectors on the connector module is adjustable.

12. The blind mating structure of claim 1, wherein the centering point comprises a flexible detent that at least partially secures a ball head of the positioning slider to the centering point when the one or more fluid connectors on the one or more coolant distribution manifolds and corresponding fluid connectors on the connector module are blind mated.

13. An electronic rack, comprising:
a plurality of coolant distribution manifolds, each comprising one or more fluid connectors;
a server, the server including:
a cooling module having a coolant supply line, a coolant return line, and a heat transfer unit, wherein a first end of the coolant supply line and a first end of the coolant return line are coupled to the heat transfer unit;
a connector module coupled to a sliding channel that is coupled to the server, the sliding channel configured to slide the connector module in a horizontal (x-axis) direction and a vertical (y-axis) direction, the connector module having:
a plurality of fluid connectors coupled to the connector module, wherein each fluid connector of the plurality of fluid connectors is coupled to either a second end of the coolant supply line or a second end of the coolant return line, and each fluid connector is configured to blind mate to one of a plurality of corresponding fluid connectors on a coolant distribution manifold of the plurality of coolant distribution manifolds in the electronic rack, and
a positioning slider coupled to the connector module, the positioning slider configured to apply a horizontal force (x-axis), a vertical force (y-axis), or both a horizontal and a vertical force to the connector module; and
a guiding module, coupled to the plurality of coolant distribution manifolds, the guiding module having a tapered portion with an opening at a first end of the guiding module and the guiding module tapering from the first end to a centering point at a second end of the guiding module,
wherein the positioning slider applies the horizontal force, the vertical force, or both the horizontal and the vertical force to the connector module in response to the positioning slider contacting the tapered portion of the guiding module during installation of the server into the electronic rack.

14. The electronic rack of claim 13, further comprising an elastic connection fitted between the guiding module and the plurality of coolant distribution manifolds such that, in response to the positioning slider of the server being in contact with the centering point while the server is being inserted further into the electronic rack, the elastic connection is compressed, moving the centering point further away from the first end of the guiding module.

15. The electronic rack of claim 13, wherein the centering point is located in alignment with a center of the first end, wherein the tapered portion is configured to receive the positioning slider from the connector module of the server being inserted into the electronic rack, and wherein the tapered portion is configured to guide the positioning slider toward the centering point at the second end of the guiding module as the server is inserted further into the electronic rack, thereby sliding the connector module and aligning the plurality of fluid connectors on the connector module of the server with the plurality of corresponding fluid connectors on the plurality of coolant distribution manifolds.

16. The electronic rack of claim 13, wherein a length of the positioning slider is determined by a length of the plurality of fluid connectors coupled to the connector module, a length of the plurality of corresponding fluid connectors on the coolant distribution manifold, and a depth of the guiding module coupled to the plurality of coolant distribution manifolds.

17. The electronic rack of claim 16, wherein a width or diameter of the positioning slider is determined by the length of the positioning slider and a magnitude of the horizontal force and a magnitude of the vertical force imposed upon the positioning slider as the server is inserted into the electronic rack.

18. The electronic rack of claim 13, wherein the positioning slider is replaceable at the connector module with a different length or different shape of positioning slider.

19. The electronic rack of claim 13, wherein a head portion of the positioning slider is shaped to be received by the tapered portion of the guiding module at the centering point of the guiding module, and wherein an orientation and location of the one or more fluid connectors on the connector module is selectable or adjustable.

20. The electronic rack of claim 13, wherein the centering point comprises a flexible detent that partially secures a ball head of the positioning slider to the centering point when the one or more fluid connectors on the plurality of coolant distribution manifolds and corresponding fluid connectors on the connector module are blind mated.

* * * * *